US012751106B2

(12) United States Patent
Chan et al.

(10) Patent No.: US 12,751,106 B2
(45) Date of Patent: Sep. 29, 2026

(54) ENHANCED DUAL-BAND NIGHT VISION SYSTEM

(71) Applicant: SRI International, Menlo Park, CA (US)

(72) Inventors: Winston K. Chan, Princeton, NJ (US); David John Hill, Lawrenceville, NJ (US)

(73) Assignee: SRI International, Menlo Park, CA (US)

( * ) Notice: Subject to any disclaimer, the term of this patent is extended or adjusted under 35 U.S.C. 154(b) by 374 days.

(21) Appl. No.: 18/446,996

(22) Filed: Aug. 9, 2023

(65) Prior Publication Data

US 2024/0055545 A1 Feb. 15, 2024

Related U.S. Application Data

(60) Provisional application No. 63/370,857, filed on Aug. 9, 2022.

(51) Int. Cl.

| | |
|---|---|
| ***H10F 30/26*** | (2025.01) |
| ***H05B 45/10*** | (2020.01) |
| ***H05B 47/11*** | (2020.01) |
| ***H10F 55/155*** | (2025.01) |

(52) U.S. Cl.

CPC ........... *H10F 55/155* (2025.01); *H05B 45/10* (2020.01); *H05B 47/11* (2020.01); *H10F 30/263* (2025.01)

(58) Field of Classification Search

CPC ...... H10F 55/155; H10F 30/263; H10F 55/18; H10F 77/146; H05B 45/10; H05B 47/11; H01L 25/167; H03K 17/79; H10H 29/10

See application file for complete search history.

(56) References Cited

U.S. PATENT DOCUMENTS

| | | | | |
|---|---|---|---|---|
| 2003/0092212 | A1* | 5/2003 | Buchanan | B82Y 20/00 438/54 |
| 2004/0021417 | A1* | 2/2004 | Kan | H01J 1/34 313/542 |
| 2005/0083567 | A1* | 4/2005 | Chun Liu | H10F 55/255 359/326 |
| 2011/0254450 | A1* | 10/2011 | Bergholz | H05B 45/58 315/121 |
| 2015/0008390 | A1* | 1/2015 | Lewis | H10F 55/00 438/24 |
| 2022/0102583 | A1* | 3/2022 | Baumheinrich | G02B 6/105 |

OTHER PUBLICATIONS

Baur et al., "Influence of strain on growth mode and electro-optical properties of high-brightness InGaN-LEDs on SiC", Journal of Crystal Growth, vol. 230, No. 3-4, Sep. 2001, pp. 507-511.

(Continued)

*Primary Examiner* — Uzma Alam
*Assistant Examiner* — Mamadou Faye
(74) *Attorney, Agent, or Firm* — Shumaker & Sieffert, P.A.

(57) ABSTRACT

An example image intensifier includes a quantum well infrared photodetector (QWIP) configured to receive photons to photoexcite carriers out of a localized quantum state; and a light emitting diode (LED), wherein the photoexcited carriers control the LED.

19 Claims, 3 Drawing Sheets

(56) References Cited

OTHER PUBLICATIONS

Beeler et al., "III-nitride semiconductors for intersubband optoelectronics: a review", Semiconductor Science and Technology, vol. 28, No. 7, Jun. 21, 2013, 26 pp.
Chan et al., "Optically controlled surface-emitting lasers", Applied Physics Letters, vol. 58, No. 21, May 27, 1991, p. 2342-2344.
Chen et al., "Broadband Achromatic Metasurface-Refractive Optics", Nano Lett., Nov. 13, 2018, p. 7801-7808.
Deemer et al., "Low Vision Enhancement with Head-mounted Video Display Systems: Are We There Yet?", Optom. Vis. Sci., vol. 95, No. 9, Sep. 2018, p. 694-703.
Gagnon et al., "In Situ Stress Measurements During GaN Growth on Ion-Implanted AlN/Si Substrates", Journal of Electronic Materials vol. vol. 41, No. 5, Dec. 16, 2011, p. 865-872.
Grandusky et al., "Optimization of the active region of InGaN/GaN 405 nm light emitting diodes using statistical design of experiments for determination of interaction effects", J. Vac. Sci. Technol. B, vol. 23, No. 4, Jul. 21, 2005, p. 1576 -?.
Groever et al., "Meta-Lens Doublet in the Visible Region", Nano Letters, Jun. 29, 2017, p. 4902-4907.
Keller et al., "Growth and characterization of bulk InGaN films and quantum wells", Applied Physics Letters, May 27, 1996, p. 3147-3149.
Liang et al., "High performance metalenses: numerical aperture, aberrations, chromaticity, and trade-offs", Optica, vol. 6, No. 12, Nov. 22, 2019, pp. 1461-1470.
Lin et al., "Topology Optimized Multi-layered Meta-optics", arXiv:1706.06715v1, Jun. 21, 2017, 9 pp.
Luo et al., "Pixelless Imaging Device Using Optical Up-Converter", IEEE Electron Device Letters, vol. 25, No. 3, Mar. 3, 2004, pp. 129-131.
Mahaboob et al., "Drain-Voltage-Induced Secondary Effects in AlGaN/GaN HEMTs With Integrated Body-Diode", IEEE Transactions on Electron Devices, vol. 67, No. 10, Jun. 24, 2020, pp. 3983-3987.
Mahaboob et al., "Dynamic Control of AlGaN/GaN HEMT Characteristics by Implementation of a p-GaN Body-Diode-Based Back-Gate", IEEE Journal of the Electron Devices Society, vol. 7, May 6, 2019, pp. 581-588.
Mahaboob et al., "Investigation of the electrical behavior of AlGaN/GaN high electron mobility transistors grown with underlying GaN:Mg layer", J. Vac. Sci. Technol. B, vol. 38, No. 6, Oct. 5, 2020, pp. 062204-1-062204-5.
Mann et al., "Nonreciprocal cavities and the time-bandwidth limit", Optica, vol. 6, No. 1, Jan. 17, 2019, pp. 104-110.
Martins et al., "On Metalenses with Arbitrarily Wide Field of View", ACS Photonics, vol. 7, No. 8, Jun. 30, 2020, p. 2073-2079.
McClung et al., "At-will chromatic dispersion by prescribing light trajectories with cascaded metasurfaces", Light: Science & Applications, May 27, 2020, 9 pp.
McIntyre, "Multiplication noise in uniform avalanche diodes", IEEE Transactions on Electron Devices, vol. ED-13, No. 1, Jan. 1966, pp. 164-168.
Meem et al., "Inverse-designed achromatic flat lens enabling imaging across the visible and near-infrared with diameter > 3?mm and NA = 0.3", Applied Physics Letters, vol. 117, No. 4, Jul. 27, 2020, pp. 041101-1-041101-4.
Miller, "Fundamental Limit to Linear One-Dimensional Slow Light Structures", Physical Review Letters, vol. 99, Nov. 15, 2007, 7 pp.
Neugebauer et al., "Hydrogen in GaN: Novel Aspects of a Common Impurity", Physical Review Letters, vol. 75, No. 24, Dec. 11, 1995, p. 4452-4455.
Neugebauer et al., "Role of hydrogen in doping of GaN", Applied Physics Letters, vol. 68, No. 13, Mar. 25, 1996, p. 1829-1831.
Nicolay et al., "Strain-induced interface instability in GaN/AlN multiple quantum wells", Applied Physics Letters, vol. 91, No. 6, Aug. 10, 2007, pp. 061927-1-061927-3.
Petroff et al., "Detection of individual 0.4-28 μm wavelength photons via impurity-impact ionization in a solid-state photomultiplier", Applied Physics Letters, vol. 51, No. 6, Aug. 10, 1987, p. 406-408.
Presutti et al., "Focusing on bandwidth: achromatic metalens limits", Optica, vol. 7, No. 6, Jun. 3, 2020, pp. 624-631.
Pu et al., "Nanoapertures with ordered rotations: symmetry transformation and wide-angle flat lensing", Optics Express, vol. 25, No. 25, Dec. 4, 2017, pp. 31471-31477.
Razeghi et al., "III-Nitride Optoelectronic Devices: From ultraviolet detectors and visible emitters towards terahertz intersubband devices", 2010 23rd Annual Meeting of the IEEE Photonics Society, Nov. 7, 2010, 4 pp.
Rocco et al., "Cs-free N-polar III-nitride photocathode detectors with high quantum efficiency: role of impurity incorporation at interfaces and planes", Gallium Nitride Materials and Devices XVI, Mar. 5, 2021, p. 0.
Sawant et al., "Mitigating Chromatic Dispersion with Hybrid Optical Metasurfaces", Adv. Mater., vol. 31, No. 3, Nov. 23, 2018, 6 pp.
Shahedipour-Sandvik et al., "Deep green emission at 570nm from InGaN/GaN MQW active region grown on bulk AlN substrate", Fifth International Conference on Solid State Lighting, Sep. 14, 2005, pp. 594107-1-594107-8.
Sohi et al., "Critical thickness of GaN on AlN: impact of growth temperature and dislocation density", Semiconductor Science and Technology, vol. 32, No. 7, Jun. 27, 2017, 6 pp.
Suvarna et al., "Design and Growth of Visible-Blind and Solar-Blind III-N APDs on Sapphire Substrates", Journal of Electronic Materials vol. Mar. 23, 2013, p. 854-858.
Tennant, "Rule 07' Revisited: Still a Good Heuristic Predictor of p/n HgCdTe Photodiode Performance?", Journal of Electronic Materials, vol. 39, No. 7, Feb. 6, 2010, p. 1030-1035.
Tripathi et al., "AlGaN based III-nitride tunnel barrier hyperspectral detector: Effect of internal polarization", Journal of Applied Physics, Jun. 27, 2011, 11 pp.
Van De Walle, "Interactions of hydrogen with native defects in GaN", Physical Review B, vol. 56, No. 16, Oct. 15, 1997, p. R10020-R10023.
Wang et al., "Chromatic-aberration-corrected diffractive lenses for ultra-broadband focusing", Scientific Reports, Feb. 12, 2016, 7 pp.
Wang et al., "Theoretical analysis of confined quantum state GaAs/AlGaAs solid-state photomultipliers", IEEE Journal of Quantum Electronics, vol. 26, No. 2, Feb. 1990, pp. 285-295.
Zhou et al., "Flat optics for image differentiation", Nature Photonics, Feb. 24, 2020, 9 pp.
Zhou et al., "Multifunctional metaoptics based on bilayer metasurfaces", Light: Science & Applications vol. Sep. 4, 2019, 9 pp.
Zhou et al., "Multilayer Noninteracting Dielectric Metasurfaces for Multiwavelength Metaoptics", Nano Lett, Nov. 5, 2018, p. 7529-7537.

* cited by examiner

ENHANCED DUAL-BAND NIGHT VISION SYSTEM

This application claims the benefit of U.S. Provisional Patent Application No. 63/370,857, filed Aug. 9, 2022, the entire contents of which is incorporated herein by reference.

GOVERNMENT RIGHTS

This invention was made with Government support under Contract Number HR001122C0043 awarded by the Defense Advanced Research Projects Agency. The Government has certain rights in this invention.

TECHNICAL FIELD

The disclosure relates to night vision systems.

BACKGROUND

Night vision systems typically use numerous refractive optics to minimize aberrations. These heavy optics may extend far from the user's center of gravity, causing strain on the user. Image intensifiers of night vision systems have typically used a photocathode coupled to a high-voltage microchannel plate to absorb light, amplify it electronically, and output a visible light image from a phosphor screen.

SUMMARY

Described herein is an image intensifier, of a Night Vision (NV) system, that monolithically integrates a broadband quantum well infrared photodetector (QWIP) IR absorber and visible-band light emitting diode (LED). An NV system with an image intensifier in accordance with this disclosure, may support full NIR (near infrared)+SWIR (shortwave infrared) bands, with each infrared (IR) band mapped to two distinct visible-band wavelengths without sacrificing spatial or temporal resolution, with a design and integration methodology that could apply to selected other bands as well.

An NV system including an image intensifier in accordance with this disclosure may include: band selective absorbers, wherein a response can be tuned to bands of interest while allowing selective transmission; pixel-less design, which achieves superior resolution, eliminates Moire fringes when viewing scenes with periodic patterns, and avoids pitfalls of pixel fabrication-limited performance; and multi-band visualization, which allows simultaneous information about multiple IR bands without loss of resolution.

In one example, an image intensifier comprises a quantum well infrared photodetector (QWIP) configured to receive photons to photoexcite carriers out of a localized quantum state; and a light emitting diode (LED), wherein the photoexcited carriers control the LED.

In one example, an NV system includes a circuit comprising: a photothyristor; a transistor; and a gate voltage source, wherein the gate voltage source biases a gate of the transistor and the photothyristor serves as an active load for the transistor.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

Like reference characters refer to like elements throughout the figures and description.

DETAILED DESCRIPTION

Figure 1:
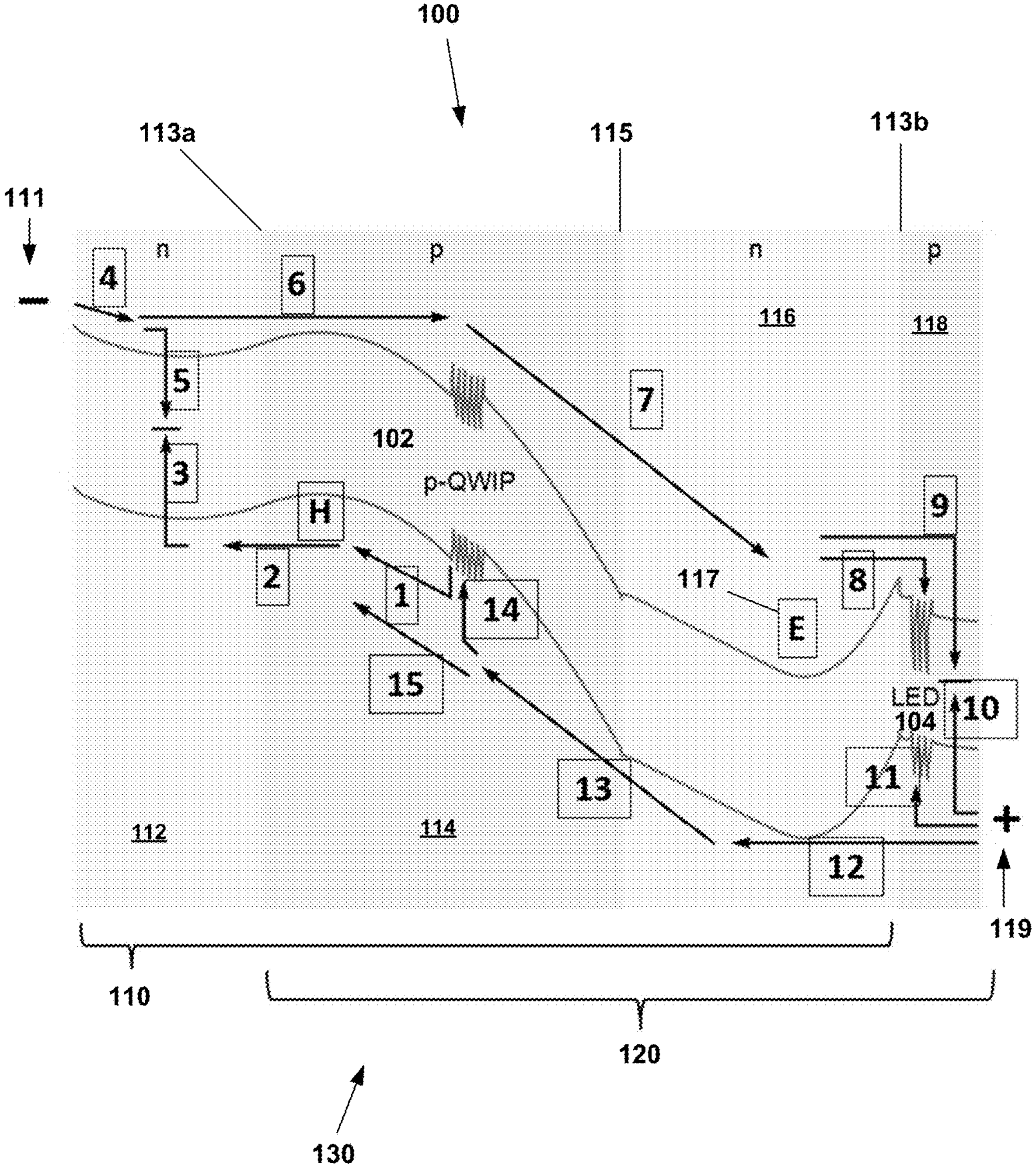
FIG. 1 is a diagram of an image intensifier in accordance with techniques of this disclosure.

A primary component of a NV system is an image intensifier. Image intensifiers have used a photocathode coupled to a high-voltage microchannel plate to absorb light, amplify it electronically, and output a visible light image from a phosphor screen. Limited IR responsivity and inability to compactly display multi-band information limits the usefulness of these types of image intensifiers.

In some examples, an NV system of this disclosure may include an image intensifier that monolithically integrates a broadband quantum well infrared photodetector (QWIP) IR absorber and visible-band light emitting diode (LED). In some examples, the image intensifier may be an all-solid-state, GaN-based image intensifier. In some examples, an image intensifier integrating a QWIP and an LED may be integrated within about a 3 μm thick structure.

The NV system in some examples of this disclosure, such as those that include an image intensifier of this disclosure, may emit at separate visible-band wavelengths for each of the incident IR bands, enabling the production of a multi-color image that simultaneously represents information from multiple IR bands (e.g., NIR+SWIR). Multi-band functionality may provide a user with unprecedented night-vision capability in a system wearable for long-term, such as for nighttime or low-light activities such as surveillance, search and rescue, security, gaming (e.g., paintball), exploring (e.g., caves), or other activities.

Conventional image intensifiers rely on PMT technology, requiring significant length, high vacuum, and high voltage. In some examples, the NV system of this disclosure may include an analog, planar, low-power image intensifier that enables high optical-bandwidth transduction of IR light to visible light with gain and can operate at >60 Hz.

Features of the image intensifier of this disclosure may include monolithic integration of QWIP absorber and LED emitter, without complex heterogeneous integration. Each image intensifier may be about 3 μm thick, for high resolution. Valence band QWIP may allow for absorption at normal incidence. A pixel-less architecture means that resolution may be dictated by an optical system, and not by pixel geometry and a strong internal electric field minimizes lateral carrier diffusion. The pixel-less architecture enables a high fill factor and eliminates the need for high density of discrete pixels, the need for complex fabrication, and/or the need for a network of conductors for pixel-based approaches. It also allows an individual image intensifier for each of the NIR and SWIR bands to be integrated without stringent lateral tolerancing.

The image intensifier may enable discrimination between NIR & SWIR bands and with its pixel-less design may achieve high resolution while avoiding complex lithography and fabrication. The image intensifier may be a semiconductor structure that monolithically integrates three functions that are performed serially: detection of the excitation light, amplification of photocurrent, and emission of amplified and wavelength-shifted light. The image intensifier may include a p-cladding layer on one end and an n-cladding layer at another end, a quantum well IR photodetector (QWIP), such as a p-QWIP, and a light emitting diode (LED), such as a p-type visible LED, forming a p-n-p-n structure. The image intensifier may be biased so that the p-cladding layer is positive relative to the n-cladding layer.

Additionally, the image intensifier plane allows for low power operation. As a non-limiting example, the image intensifier plane involves approximately 10 V requirements, total current draw of about 100 RA, with 5 small CR2032 Li batteries in series providing 2200 hours of operation, without a need for any voltage step-up circuit.

The quantum wells may be replenished with holes for the image intensifier to continue functioning. These holes come from the holes injected into the p-cladding layer of the biased image intensifier. In some examples, most of the injected holes recombine with electrons in the LED to produce the visible image, but some holes go past the LED and into the QWIP. An image intensifier thickness may be about 3 μm, so pixels could be etched into the image intensifier. In some examples, the image intensifier has a pixel-less architecture, where the spatial resolution is maintained through the structure by having a strong electric field that minimizes lateral diffusion to ~0.2 μm. Such an architecture has the advantages of simpler fabrication, higher fill factor, not needing a network of conductors to bias each pixel, and not needing to align image intensifier modules, so the conductors of one module does not block the light for the other. This structure naturally may have a strong field in the QWIP section, which account for much of the thickness.

Further, bandgaps may be aligned for appropriate NIR and SWIR absorption, mapped to green and blue emission, respectively. In some examples, a multi-band image intensifier may integrate optics and image intensifiers for NIR and SWIR.

Other features of the integrated NV system may include an image intensifier design that locates the NIR and SWIR bands at separate locations along the optical axis, harnessing chromatic dispersion such that correction is only needed within the bands. Simultaneous imaging of NIR and SWIR bands may be provided through a multicolor image.

FIG. 1 shows an example of an image intensifier 100. Image intensifier 100 includes a first transistor 110 and a second transistor 120. In some examples, the first transistor 110 and the second transistor 120 form a photothyristor 130 of the image intensifier 100. The photothyristor 130 may be both photosensitive and light emitting. The image intensifier 100 may include a first layer 112, a second layer 114, a third layer 116, and a fourth layer 118. The first layer 112 may be an n-layer, the second layer 114 may be a p-layer, the third layer 116 may be an n-layer, and the fourth layer 118 may be a p-layer 118. In some examples, photothyristor 130 may be an n-p-n-p photothyristor and the QWIP 104 may be closer to an n end side of the photothyristor 130. In some examples, the first transistor 110 may include the first layer 112, the second layer 114, and the third layer 116. In some examples, the second transistor 120 may include the second layer 114, the third layer 116, and the fourth layer 118. In some examples, the first transistor 110 may be a n-p-n phototransistor. In some examples, the second transistor 120 may be a p-n-p bipolar transistor.

In some examples, first layer 112 may be an emitter for the first transistor 110. The second layer 114 may be a base for the first transistor and be a collector for the second transistor 120. The third layer 116 may be a collector for the first transistor 110 and be a base for the second transistor 120. The fourth layer 118 may be an emitter for the second transistor 120.

In some examples, the image intensifier 100 may include a QWIP 102 and a LED 104. The QWIP 104 may be configured to receive photons to photoexcite carriers, such as holes and/or electrons, out of a localized quantum state, and the photoexcited carriers may control the LED 104. In some examples, the QWIP 102 and the LED 104 are embedded within the photothyristor 130 of the image intensifier 100.

In some examples, such as shown in FIG. 1, QWIP 102 is a p-QWIP. In some examples, p-QWIP 102 may be located in the undepleted portion of the first transistor 110 base, for example second layer 114. In some examples, as shown in FIG. 1, LED 104 may be located in an emitter of the second transistor, for example fourth layer 118. While not shown in FIG. 1, in some examples, LED 104 may be located in a base of the second transistor, for example third layer 116. In some examples, the p-QWIP 102 and LED 104 being embedded in photothyristor 130 may create an electronic switch because first transistor 110 and second transistor 120 are connected to amplify the output of the other.

In some examples, the thinness of the image intensifier 100 (e.g., about 3 μm), the narrow band absorption of the p-QWIP 102 and the narrow and the adjustable emission of the LED 104 may enable stacking of two or more image intensifiers with each image intensifier absorbing a different wavelength band and emitting a different wavelength without crosstalk.

In some examples, image intensifier 100 may not be pixelated, which causes the NV system resolution to be determined by the NV system rather than the image intensifier 100. The image intensifier 100 not being pixelated may cause the image intensifier 100 to have a high fill factor due to a lack of pixel boundaries. The image intensifier 100 not being pixelated may simplify fabrication of the image intensifier 100, which may reduce production cost.

In some examples, the thinness of the image intensifier 100, the narrow band absorption of the p-QWIP 102 and the narrow and the adjustable emission of the LED 104 may enable stacking of two or more image intensifiers with each image intensifier absorbing a different wavelength band and emitting a different wavelength without crosstalk.

In reference to FIG. 1, first layer 112 is referred to as the “left side” of photothyristor 130 and fourth layer 118 is referred to as the “right side” of photothyristor 130. The right side of photothyristor 130 is biased positively relative to the left side of the photothyristor 130, which forms photothyristor 130 to be qualitatively different from a cascading QWIP with an LED. The first transistor 110 may be referred to as the “front end” of the image intensifier 100.

The p-QWIP 102 may be a photosensitive portion of photothyristor 130. As an example, for the following discussion of a complete cycle from the photoexcited current to the current added to the photocurrent, reference to items (1)-(15) of FIG. 1 may be made. In some examples, (1) p-QWIP 102 may include carriers, such as electrons and/or holes, in wells that may be photoexcited out of the wells of p-QWIP 102 and drift toward an emitter-base junction of the first transistor 110, which is the junction of the first layer 112 and the second layer 114.

In some examples, (2) the holes may not be able to enter the first layer 112 until enough charge from the holes accumulating in the second layer 114 sufficiently lowers an emitter-base barrier of the first transistor 110 for some holes to be thermionically emitter in to first layer 112 (3) where they may recombine with electrons at Shockley-Read-Hall centers because the holes are minority carriers in first layer 112. In some examples, (6) the lowered emitter-base barrier of the first transistor 110 may reduce the barrier allowing electrons to flow from the first layer 112 to the second layer 114. In some examples, (2) the magnitude of the electron current across the junction 113*a* between the first layer 112 and the second layer 114 may be β times larger than the hole current across the junction 113*a*. In some examples, the gain β may be determined by the relative emitter (e.g., first layer 112) and base (e.g., second layer 114) doping. Additionally or alternatively, the gain β may be determined by other factors as well.

(5) Electrons recombining with holes in first layer 112 and (6) flowing in the second layer 114 may be (4) supplied by an external power supply 111. (7) The electrons from the emitter of the first transistor 110 (e.g., first layer 112) drift across the base region of the first transistor 110 (e.g., second layer 114), the p-QWIP 102 and into the collector of the first transistor 110 (e.g., third layer 116). In some examples, the electric field of the collector of the first transistor 110 (e.g., third layer 116) may be increased to generate a higher gain. The electric field of the collector of the first transistor 110 (e.g., third layer 116) may be increased by adjusting geometry and/or doping for the electrons to provide impact ionization gain. In some examples, (8) a high percentage of electrons will be captured in a conduction band minimum 117 of the collector of the first transistor 110 (e.g., third layer 116) or in wells of the LED 104 where the electrons will radiatively recombine to emit light.

The current of the electrons drifting into the collector of the first transistor 110 (e.g., third layer 116) may be referred to as a collector current of the first transistor 110. The collector current of the first transistor 110 becomes a base current of the second transistor 120. Electrons may be trapped in the conduction band minimum 117 where the charge of the trapped electrons pushes the bands in the third layer 116 upward and decrease the barrier for electrons to be injected into the emitter of the second transistor 120 (e.g., fourth layer 118) or (8) they may be trapped in the wells of the LED 104 where they radiatively recombine or (9) the electrons with sufficient energy may be injected into the emitter of the second transistor 120 (e.g., fourth layer 118) where the electrons recombine at Shockley-Read-Hall centers.

The electrons trapped at the conduction band minimum 117 may lower the emitter-base barrier of the second transistor 120 equally in the conduction and valence bands. In some examples, since the electrons trapped at the conduction band minimum 117 lowers the emitter-base barrier of the second transistor 120 equally in the conduction and valence bands, (9) the number of holes injected from the emitter of the second transistor 120 (e.g., fourth layer 118) into the base of the second transistor 120 (e.g., third layer 116) is proportional to the number of electrons injected from the base of the second transistor 120 (e.g., third layer 116) into the emitter of the second transistor 120 (e.g., fourth layer). In some examples, the ratio of the current of holes being injected from the emitter of the second transistor 120 into the base of the second transistor 120 to the current of electrons being injected from the base of the second transistor 120 into the emitter of the second transistor 120 is transistor gain β'.

In some examples, (10) power source 119 supplies the holes needed for the recombination occurring at the Shockley-Read-Hall centers and injection into the base of the second transistor 120 (e.g., third layer 116). In some examples, power source 119 may be an external power source. (11) The holes injected into the emitter of the second transistor 120 (e.g., fourth layer 118) will participate in the radiative recombination at the LED 104 or (12) drift into the collector of the first transistor 110 (e.g., third layer 116). In some examples, implementing impact ionization gain will multiply electrons and holes, and the holes and electrons may be multiplied at different rates. In some examples, (13) implementing impact ionization gain may cause the hole current leaving the collector of the first transistor 110 (e.g., third layer 116) to be greater than the hole current entering the collector of the first transistor 110 (e.g., third layer 116).

(14) When the holes reach p-QWIP 104, some of the holes will be captured by the wells of the p-QWIP to replenish holes that were earlier photoexcited out of the p-QWIP 104. In some examples, (15) holes that are not captured may be indistinguishable from holes that are photoexcited out of the p-QWIP 104 wells which may add to the primary photocurrent in a steady-state case.

At the end of one complete cycle from the photoexcited current to the current added to the photocurrent, as described above, holes accumulate in the second layer 114, such as at point H, and electrons accumulate in the third layer 116, such as at point E. The positive charge of the holes in the second layer 114, such as at point H, lowers the potential of the second layer 114. The negative charge of the electrons in the third layer 116, such as at point E, raises the potential of the third layer 116.

When the right side of photothyristor 130 being biased positive relative to the left side of photothyristor 130, the p-n emitter-base junction 113*a* of the first transistor 110 and the p-n emitter-base junction 113*b* of the second transistor 120 are forward bias since their p-side are more positive than their n-side. The voltage across the photothyristor 130 is high with most of the voltage dropped across the reverse biased junction. The current in the photothyristor 130 may be on the order of the amplified leakage of the second layer 114 and the third layer 116 and photogenerated currents, which may be below an LED visibility current threshold. In some examples, this high-voltage, low-current state may be referred to as an "off-state."

When the accumulate charges are above a charge threshold, the p-side (e.g., second layer 114) of the central junction 115 between the second layer 114 and the third layer 116 becomes more positive than the n-side (e.g., third layer 116) of the central junction 115. In some examples, the photothyristor 130 may switch from being reverse biased to forward biased. In some examples, switching may occur when beta*beta'>1. The switched state is very conductive as it may include three diode voltage drops and a voltage drop across parasitic resistance. In some examples, current in the photothyristor 130 may be limited by an external circuit due to the current in the photothyristor 130 being too high. In some examples, this low-voltage, high-current state may be referred to as an "on-state."

In some examples, a positive feedback loop may result in a switching behavior of the photothyristor 130. For example, when image intensifier 100 is turned on, such as by turning on an NV system including the image intensifier 100, the image intensifier 100 is in the "off-state." In some examples, when the loop gain is greater than 1, the image intensifier 100 switches to the "on-state" and may be self-sustaining until bias is turned off. In some examples, in between cycles, the image intensifier 100 may require a period of time to recover as the stored charges at points H and E recombine. For example, the period of time may be between 20-50 μs. In another examples, the period of time may be between 10-80 μs.

In some examples, the image intensifier 100 may be a semiconductor structure that monolithically integrates three functions that are performed serially: detection of the excitation light, amplification of photocurrent, and emission of amplified and wavelength-shifted light.

The image intensifier 100 may be an analog, planar, low-power image intensifier that enables high optical-bandwidth transduction of IR light to visible light with gain and can operate at >60 Hz. The image intensifier 100 may enable discrimination between NIR & SWIR bands. In some examples, the image intensifier 100, with a pixel-less design, may achieve high resolution while avoiding complex lithography and fabrication. In some examples, an NV system may integrate two image intensifiers, such as image intensifier 100 described above, one for each of the NIR and SWIR band.

In some examples, the image intensifier 100 may include $Al_xGa_{1-x}N$ and/or $In_yGa_{1-y}N$ alloys. In these alloys, the "x" and/or "y" indicate variables that may vary in value.

Figure 2:
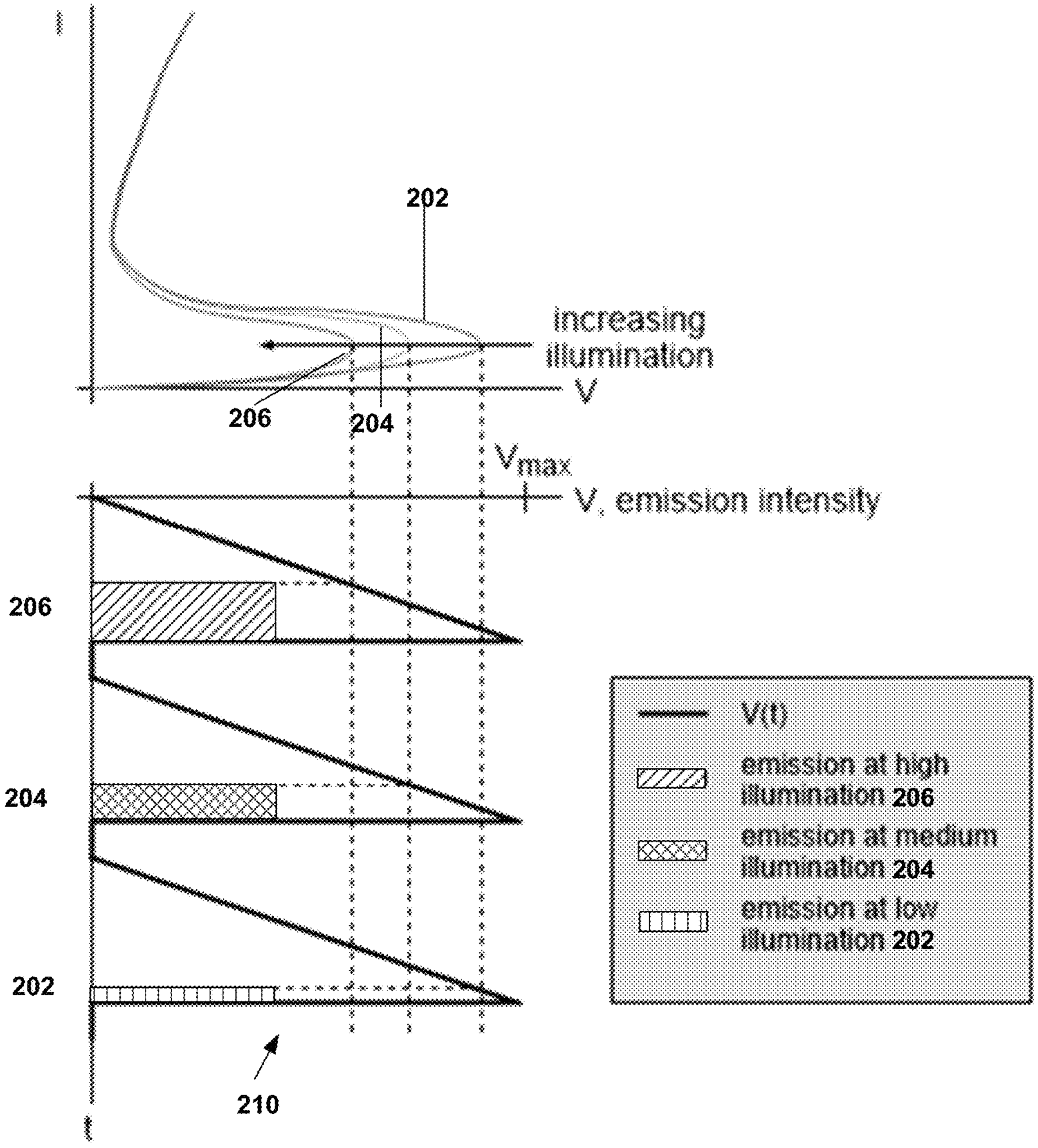
FIG. 2 is a diagram showing a sawtooth voltage graph in accordance with techniques of this disclosure.

As shown as an example in FIG. 2, while the phototHyristor 130 appears digital to drive the LED 104 from a fully off state to fully on state or vice versa, a pulse width modulates the LED 104 brightness in an analog manner. A time-dependent waveform may drive LED 104 and use the switching to generate a pulse width modulated current to drive the LED 104. In some examples, biasing the image intensifier with a monotonically increasing waveform, such as a sawtooth waveform 210, as shown in FIG. 2, may allow access to the illumination-dependence of the threshold voltage. As shown in FIG. 2, there is a pause between pairs of sawteeth of the sawtooth waveform 210. In some examples, the pause between pairs of sawteeth may be about 50 μs. In some examples, the sawtooth waveform 210 may include emission at high illumination 206, emission at medium illumination 204, and emission at low illumination 202. As shown in FIG. 2, three progressively higher levels of illumination are represented by curves 202, 204, and 206, and cause the switching of the photothyristor 130 to occur at progressively earlier times after the start of sawtooth voltage. In some examples, photothyristor 130 being turned off at the same time for each cycle may cause the period of time the LED 104 is on to be progressively longer as the illumination increases. An eye of a person or animal may perceive the modulated LED 104 output as a constant output with a brightness proportional to the average brightness rather than a series of flashes when the sawtooth repetition rate is greater than a repetition threshold. For example, the repetition threshold may be 30 Hz. In other examples, the repetition threshold may be between 25-35 Hz.

Figure 3:
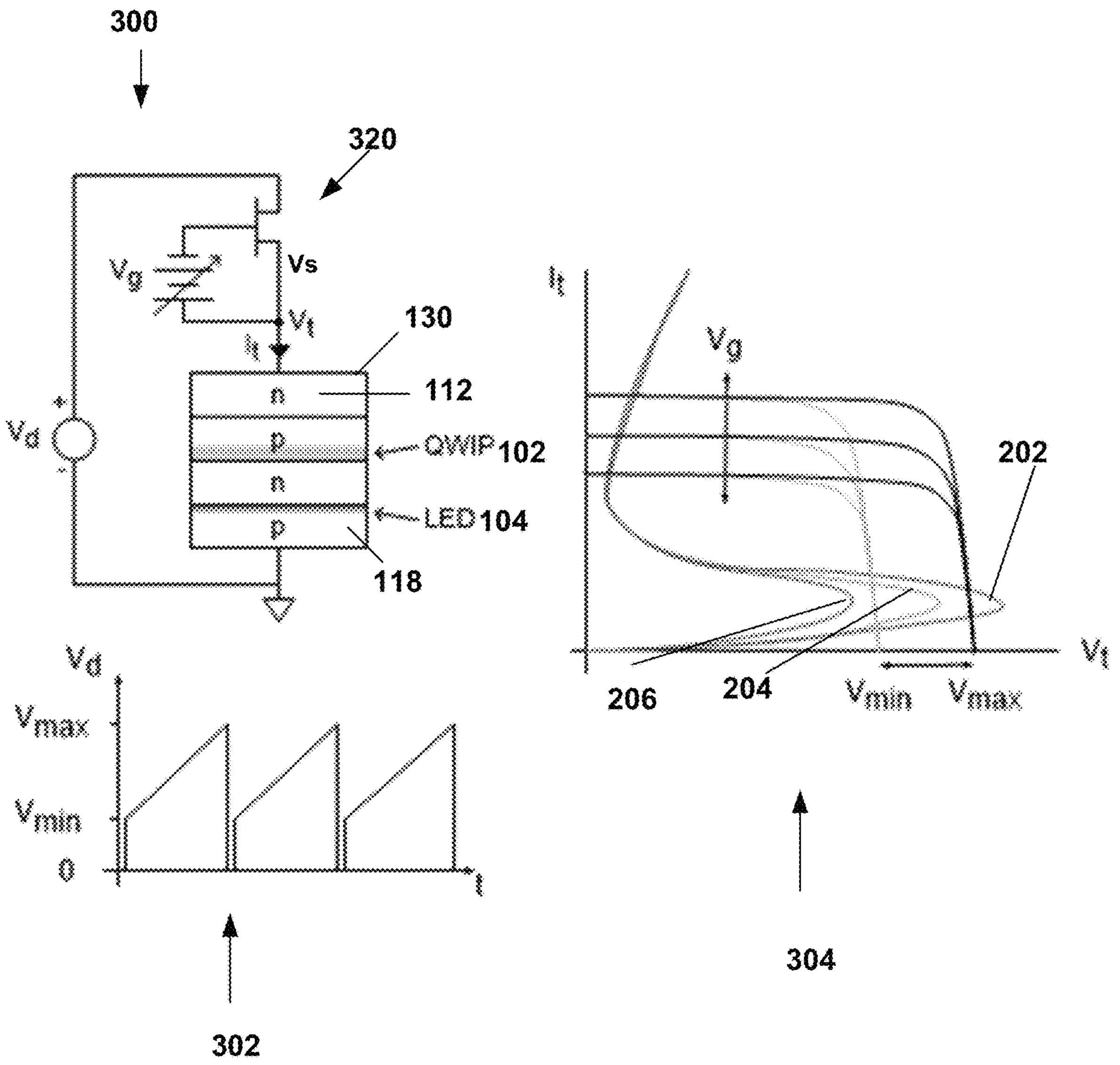
FIG. 3 is a diagram showing various parts of a circuit including a photothyristor of an image intensifier and characteristic of the circuit in accordance with techniques of this disclosure.

FIG. 3 shows a circuit 300 of a NV system and the waveform 302 of the drain voltage source $V_d$ of circuit 300 providing voltage at the drain of transistor 320. In some examples, as shown in FIG. 3, the photothyristor 130 may be biased with a transistor 320 active load. In some examples, transistor 320 may be a field-effect transistor (FET). In some examples, the gate voltage source $V_g$ provides voltage at and biases a gate of the transistor 320, the drain voltage source $V_d$ biases a source of the transistor 320, and the photothyristor 130 serves as an active load for the transistor 320. In some examples, the drain voltage source $V_d$ biases the gate of the transistor 320 with a monotonically increasing waveform, such as a sawtooth waveform, and/or the gate voltage source $V_g$ biases the source of the transistor 320 with a monotonically increasing waveform, such as a sawtooth waveform. In some examples, $V_s$ may indicate a voltage at the emitter of transistor 320, $V_t$ may indicate a voltage at the junction of $V_g$ and the emitter of transistor 320, and $I_t$ may indicate a current being delivered to photothyristor 130. In some examples, the transistor 320 may be configured to deliver an electron current to an n-type collector layer of the photothyristor 130.

A single period of the sawtooth waveform ramps from $V_{min}$ to $V_{max}$ and then goes to zero volts for a period of time, such as about 50 μs, to reset the photothyristor 130. The gate of the FET 320 is separately biased with a gate voltage source $V_g$. Graph 304 shows the I-V characteristics of the photothyristor 130 for various illumination intensities with a load line from the active load at the beginning and at the end of the ramp. When the ramp voltage is $V_{min}$ at the beginning of the ramp, illumination levels to the photothyristor 130 at or greater than the level with knee voltage less than or equal to $V_{min}$ will switch. A "knee voltage" is a voltage threshold to switch an image intensifier 100 to an "on" state. That is, a photothyristor 130 illuminated at a level brighter than that corresponding to $V_{min}$ will switch at the beginning of the ramp to give an output pulse width equal to the duration of the ramp. Similarly, a photothyristor 130 illuminated at a level dimmer than that corresponding to $V_{max}$ will not switch so there is no output pulse. Only illumination at levels between those that give knee voltages between $V_{min}$ and $V_{max}$ gives a monotonic change with illumination level, through the variation in output pulse width, to the LED 104 output. Thus, the drain voltage waveform 302 controls the contrast. The gate voltage $V_g$, which may be controlled independent of the drain voltage $V_d$, changes the current going through the LED 104 after switching to control the LED 104 brightness. Accordingly, in some examples, the photothyristor 130 of the image intensifier 100, as described above, provides independent brightness and contrast control. In some examples, the circuit 300, as described above, also provides independent brightness and contrast control. For example, the drain voltage source $V_d$ is configured to control contrast of the LED 104 and the gate voltage source $V_g$ is configured to independently control brightness of the LED 104.

A major source of degradation in the image seen by a night vision goggle user is a temporally and spatially constant component in the image. This component does not provide any useful information, but it is more difficult to detect and identify features that are of importance to the user. The constant component may be due to thermally excited carriers within the photothyristor (dark current) or to background illumination in the scene from fog or haze. With independent brightness and contrast control, as described above with respect to the circuit and the photothyristor 130 of the image intensifier 100, $V_{max}$ in the drain voltage waveform 302 may be set to a level to prevent these extraneous currents alone from turning on the LED 104.

In some examples, replacing the linear ramp $V_d$, as described above, with a curved one may have higher illumination level resolution in dark areas than in bright areas or vice versa. The slope of the curve is positive between $V_{min}$ and $V_{max}$. The level resolution is highest where the slope of the curve is shallowest and lowest where the slope of the curve is steepest.

An integrated NV system including image intensifier 100 may provide state-of-the-art performance with respect to metrics for bandwidth and/or resolution.

For the 750-1550 nm band, dark current is the major determinant of contrast near room temperature. A dark current value for GaN-based QWIPs is estimated to be similar to the dark current density of 1×10-5 A/cm2 for GaAs-based QWIPs with a cutoff wavelength-temperature product of 1550×300 nm-K. This value may be an overestimate because it includes field-assisted tunneling over the barrier; in a short wavelength QWIP, the ground state is so much below the barrier that field-assisted tunneling from it is negligible except at very high fields. A balance between dark current and QE may be determined to minimize the dark current density to optimize the image contrast.

In the 1550-3000 nm band, contrast becomes more complicated. The QWIP dark current density for the 1550-3000 nm band may be estimated to be 1×10-4 A/cm2. This value is comparable to that of HgCdTe p-i-n photodiodes with the same cutoff wavelength and operating at the same temperature, so there is no dark current advantage of one technology over the other. Contrast between an object and open sky is still dictated by dark current, but contrast within an object and in scenes where the background is not open sky (e.g., ground-facing, urban, forest, etc.) is limited by blackbody radiation, which grows rapidly with wavelength in this band. Even the blackbody radiation from within the goggle may contribute to the background. If cold shields are added so that the goggle is at 275 K while the field of view is still at 300 K, the contrast ratio may be increased from 4.8% to 10.9%.

The image intensifier, such as the image intensifier 100 described above, may provide any one or more of the following advantages:

1. High-efficiency NIR & SWIR absorption over a wide angular range;
2. Efficient conversion of absorbed photons to charge carriers;
3. Efficient conversion of charge carriers to visible light photons at high spatial resolution;
4. Retention of IR band information.

In some examples, the image intensifier 100 may include an AlN/GaN QWIP absorber to achieve advantages 1 and 2 above. Advantage 3 may be achieved by the development of a visible light LED, and the overall pixel-less design of the image intensifier 100, whereby resolution is limited by the optical system rather than fabrication limitations. Advantage 4 may be achieved by the use of two image intensifiers in a NV system. For example, one image intensifier may be sensitive to the NIR and emit a green image, and the other image intensifier may be sensitive to the SWIR and emit a blue image, providing simultaneous display of NIR & SWIR information without loss of resolution.

In some examples, the III-nitride materials that form the basis of an image intensifier, such as image intensifier 100, may be developed using metal organic chemical vapor deposition (MOCVD). Optimization of these materials specific to the absorber, gain, and LED structures may be required to integrate the structures and achieve a high external quantum efficiency (EQE) image intensifier with targeted detection of NIR and SWIR bands and generation of visible light with the desired wavelengths. The QWIP absorber may comprise of GaN/AlN MQW with layers of well (1.5-7 nm) and barrier (1.5-5 nm). Material development in common for each of these components is described below, followed by technical description of each of the components, and integration.

In some examples, thick (about 15-20 nm) u-AlGaN barriers may include high-quality $Al_xGa_{1-x}N$. In some examples, a pulsed growth scheme may achieve significantly improved material quality relative to conventional continuous growth techniques. In this approach, trimethylaluminum (TMAl), trimethylgallium (TMGa), and ammonia may be introduced into the growth chamber sequentially, allowing for controlled Frank-van der Merwe growth.

In some examples, the fully integrated image intensifier structure may require p-type AlGaN layers below the QWIP and above the LED. A first p-AlGaN layer may be a base of the first transistor 110 (e.g., the second layer 114) and prevents and/or reduces the QWIP 102 from being depleted of holes, and a second p-AlGaN layer, such as the fourth layer 118, may provide a barrier at the surface of the LED 104, improving confinement and enhancing total system QE. Both p-AlGaN layers may also function as contact layers, allowing the monolithic image intensifier to be biased as an n-p-n-p structure.

While the presence of p-AlGaN layers may present unique challenges: (1) Attaining high hole concentration in AlGaN may be difficult due to the lack of a shallow acceptor dopant and acceptor depth increasing with Al content. (2) “Buried” (i.e., lacking exposure to a low-hydrogen atmosphere during activation via a free surface) p-type MOCVD-grown III-nitrides (including AlGaN) may be difficult to attain a free surface for hydrogen removal, a modified pulsed growth technique may be used. Buried pGaN may also be used. In some examples, QWIP 102 may be made a p-type QWIP using polarization changes. For example, providing a particular strain to QWIP 102 may give free holes without the need for acceptors.

The p-AlGaN materials used for the image intensifier must have a high enough Al composition to provide the necessary barrier and strain effects discussed above and have low enough contact resistivity to function as contact layers. To meet these goals, a range of Al compositions from 0.06 to 0.24 may be used to balance the tradeoff between Al composition and contact resistivity. Mg may be used as the acceptor dopant species.

In some examples, the composition and quality of $In_xGa_{1-x}N$ may impact LED emission wavelength as well as EQE. This composition is highly sensitive to growth temperature. InGaN composition may be optimized as a function of temperature. The mole fraction of In decreases with increasing growth temperature due to increased desorption of In at high growth temperatures. For example, InGaN grown on GaN templates may achieve $In_{0.08}Ga_{0.92}N$ at a growth temperature of 775° C., and $In_{0.34}Ga_{0.66}N$ at 575° C.

In addition to InGaN composition, strain within QWs may impact the emission wavelength. InGaN/GaN QWs grown on GaN layers under tensile strain exhibit increased emission wavelength, while growth on compressively strained GaN leads to decreased wavelength compared to an unstrained LED. The growth of QW LED structures on compressively strained layers results in a quantum-dot like growth leading to increased emission wavelength and intensity. The optimization of InGaN layers may be conducted on substrate and template layers to simulate the strain that may result from the growth of the full intensifier structure.

The foregoing system and embodiments thereof have been provided in sufficient detail, but it may be not the intention of the applicant(s) for the disclosed system and embodiments provided herein to be limiting. Additional adaptations and/or modifications are possible, and, in broader aspects, these adaptations and/or modifications are also encompassed. Accordingly, departures may be made from the foregoing system and embodiments without departing from the spirit of the system.

What is claimed is:

1. An image intensifier comprising:

a quantum well infrared photodetector (QWIP) configured to receive photons to photoexcite carriers out of a localized quantum state; and a light emitting diode (LED), wherein the photoexcited carriers control the LED, wherein the QWIP and the LED are embedded within a photothyristor.

2. The image intensifier as recited in claim 1, wherein the photothyristor is an n-p-n-p photothyristor and the QWIP is closer to an n end side of the photothyristor.

3. An image intensifier comprising:

a quantum well infrared photodetector (QWIP) configured to receive photons to photoexcite carriers out of a localized quantum state;

a light emitting diode (LED), wherein the photoexcited carriers control the LED;

a first transistor; and a second transistor.

4. The image intensifier as recited in claim 3, further comprising a first layer, a second layer, a third layer, and a fourth layer, wherein the first transistor comprises the first layer, the second layer, and the third layer, and wherein the second transistor comprises the second layer, the third layer, and the fourth layer.

5. The image intensifier as recited in claim 4, wherein the first layer is an emitter for the first transistor, the second layer is a base for the first transistor, and the third layer is a collector for the first transistor, and wherein the second layer is a collector for the second transistor, the third layer is a base for the second transistor, and the fourth layer is an emitter for the second transistor.

6. The image intensifier as recited in claim 4, wherein the first layer is an n-layer, the second layer is a p-layer, the third layer is an n-layer, and the fourth layer is a p-layer.

7. The image intensifier as recited in claim 6, wherein the QWIP is located in the second layer.

8. The image intensifier as recited in claim 6, wherein the LED is located in the fourth layer.

9. The image intensifier as recited in claim 3, wherein the first transistor is an n-p-n phototransistor and the second transistor is a p-n-p bipolar transistor.

10. The image intensifier as recited in claim 1, wherein the QWIP is a p-QWIP.

11. The image intensifier as recited in claim 1, wherein the image intensifier comprises $Al_xGa_{1-x}N$ and $In_yGa_{1-y}N$ alloys.

12. A night-vision system including a circuit comprising:

a photothyristor;

a transistor; and a gate voltage source, wherein the gate voltage source biases a gate of the transistor and the photothyristor serves as an active load for the transistor.

13. The night-vision system as recited in claim 12, wherein the photothyristor comprises:

a quantum well infrared photodetector (QWIP) configured to receive photons to photoexcite carriers out of a localized quantum state; and a light emitting diode (LED), wherein the photoexcited carriers control the LED.

14. The night-vision system as recited in claim 13, wherein the circuit further comprises a drain voltage source configured to control contrast of the LED, and wherein the gate voltage source is configured to independently control brightness of the LED.

15. The night-vision system as recited in claim 13, wherein the QWIP is a p-QWIP.

16. The night-vision system as recited in claim 12, wherein the photothyristor is an n-p-n-p photothyristor.

17. The night-vision system as recited in claim 12, wherein the transistor is configured to deliver an electron current to an n-type collector layer of the photothyristor.

18. The night-vision system as recited in claim 12, wherein a drain voltage source is configured to bias the gate of the transistor with a monotonically increasing waveform and/or the gate voltage source is configured to bias the source of a transistor with a monotonically increasing waveform.

19. A night-vision system comprising the image intensifier of claim 1.

* * * * *